(12) United States Patent
Leeser

(10) Patent No.: US 9,704,692 B2
(45) Date of Patent: Jul. 11, 2017

(54) SYSTEM FOR INSTANTANEOUS RADIOFREQUENCY POWER MEASUREMENT AND ASSOCIATED METHODS

(71) Applicant: Lam Research Corporation, Fremont, CA (US)

(72) Inventor: Karl F. Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 68 days.

(21) Appl. No.: 14/789,892

(22) Filed: Jul. 1, 2015

(65) Prior Publication Data
US 2017/0004955 A1 Jan. 5, 2017

(51) Int. Cl.
| | |
|---|---|
| *H01J 37/32* | (2006.01) |
| *G01R 21/06* | (2006.01) |
| *G01R 21/133* | (2006.01) |
| *G01R 29/08* | (2006.01) |

(52) U.S. Cl.
CPC ........ *H01J 37/32137* (2013.01); *G01R 21/06* (2013.01); *G01R 21/133* (2013.01); *G01R 29/08* (2013.01); *H01J 37/321* (2013.01); *H01J 37/3299* (2013.01); *H01J 2237/24564* (2013.01); *H01J 2237/332* (2013.01); *H01J 2237/334* (2013.01)

(58) Field of Classification Search
USPC ............ 315/169.1–169.4; 118/723 I, 723 IR, 118/723 E, 723 R, 723 VE, 723 MW, 715
See application file for complete search history.

(56) References Cited

U.S. PATENT DOCUMENTS 5,936,481 A * 8/1999 Fujii ........................ H03H 7/40
333/17.3

\* cited by examiner

*Primary Examiner* — Tuyet Vo
(74) *Attorney, Agent, or Firm* — Martine Penilla Group, LLP

(57) ABSTRACT

Each of multiple plasma processing chambers has an RF power input line connected to receive RF power from a common RF power source. An RF control module is connected to distribute RF power from the common RF power source to the RF power input lines of the multiple chambers. A voltage sensor and a current sensor are connected to a corresponding RF power input line. Each voltage sensor measures an instantaneous electrical voltage present on its RF power input line. Each current sensor measures an instantaneous electrical current present on its RF power input line. An analog multiplier module is connected to receive as inputs the instantaneous electrical voltage from its corresponding voltage sensor and the instantaneous electrical current from its corresponding current sensor. Each analog multiplier module generates an output signal that indicates an instantaneous RF power present on the corresponding RF power input line of the corresponding chamber.

17 Claims, 6 Drawing Sheets

SYSTEM FOR INSTANTANEOUS RADIOFREQUENCY POWER MEASUREMENT AND ASSOCIATED METHODS

BACKGROUND

1. Field of the Invention

The present invention relates to semiconductor device fabrication, and to systems for performing the same.

2. Description of the Related Art

Many modern semiconductor chip fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. The plasma is often generated by applying radiofrequency (RF) power to a process gas in a controlled environment, such that the process gas becomes energized and transforms into the desired plasma. The characteristics of the plasma are affected by many process parameters including, but not limited to, material composition of the process gas, flow rate of the process gas, geometric features of the plasma generation region and surrounding structures, temperatures of the process gas and surrounding materials, frequency of the RF power applied, and magnitude of the RF power applied, among others. Therefore, it is of interest to understand, monitor, and/or control some of the process parameters that may affect the characteristics of the generated plasma, particularly the magnitude of the RF power applied. It is within this context that the present invention arises.

SUMMARY

In an example embodiment, a system is disclosed for semiconductor substrate processing. The system includes a plurality of plasma processing chambers. Each of the plurality of plasma processing chambers respectively includes an RF power input line through which RF power is transmitted to generate a plasma within the plasma processing chamber. The system also includes an RF power source configured to generate RF power for transmission to the plurality of plasma processing chambers. The system also includes an RF control module connected to receive the RF power generated by the RF power source and distribute a respective portion of the RF power to each RF power input line of the plurality of plasma processing chambers. The system also includes a plurality of voltage sensors respectively connected to the RF power input lines of the plurality of plasma processing chambers, such that each of the plurality of plasma processing chambers has a separate one of the plurality of voltage sensors connected to its RF power input line. Each of the plurality of voltage sensors is configured to output a signal indicating an instantaneous electrical voltage present on the RF power input line to which it is connected. The system also includes a plurality of current sensors respectively connected to the RF power input lines of the plurality of plasma processing chambers, such that each of the plurality of plasma processing chambers has a separate one of the plurality of current sensors connected to its RF power input line. Each of the plurality of current sensors is configured to output a signal indicating an instantaneous electrical current present on the RF power input line to which it is connected. The system also includes a plurality of analog multiplier modules respectively corresponding to the plurality of plasma processing chambers. Each of the plurality of analog multiplier modules is connected to receive as a first input signal the signal indicating the instantaneous electrical voltage present on the RF power input line of its corresponding plasma processing chamber as output by the corresponding one of the plurality of voltage sensors. Also, each of the plurality of analog multiplier modules is connected to receive as a second input signal the signal indicating the instantaneous electrical current present on the RF power input line of its corresponding plasma processing chamber as output by the corresponding one of the plurality of current sensors. Each of the plurality of analog multiplier modules is configured to generate an output signal representing a product of its first and second input signals. The output signal of a given one of the plurality of analog multiplier modules indicates an instantaneous RF power present on the RF power input line of the plasma processing chamber corresponding to the given one of the plurality of analog multiplier modules.

In an example embodiment, an apparatus is disclosed for measuring RF power supplied to a plasma processing chamber. The apparatus includes a voltage sensor connected to an RF power input line of the plasma processing chamber at a connection location just outside the plasma processing chamber. The voltage sensor is configured to measure electrical voltage present on the RF power input line and output a signal indicative of the measured electrical voltage. The apparatus also includes a current sensor connected to the RF power input line of the plasma processing chamber substantially near the connection location of the voltage sensor. The current sensor is configured to measure electrical current present on the RF power input line and output a signal indicative of the measured electrical current. The apparatus also includes an analog multiplier module connected to receive as a first input signal, the signal indicative of the measured electrical voltage as output by the voltage sensor. The analog multiplier module is also connected to receive as a second input signal, the signal indicative of the measured electrical current as output by the current sensor. The analog multiplier module is configured to generate an output signal representing a product of its first and second input signals. The output signal of the analog multiplier module indicates an instantaneous RF power present on the RF power input line of the plasma processing chamber.

In an example embodiment, a method is disclosed for measuring instantaneous RF power supplied to a plasma processing chamber. The method includes an operation for measuring an electrical voltage present on an RF power input line of the plasma processing chamber as RF power is being transmitted through the RF power input line to generate a plasma within the plasma processing chamber. The method also includes an operation for measuring an electrical current present on the RF power input line of the plasma processing chamber as RF power is being transmitted through the RF power input line to generate the plasma within the plasma processing chamber. The method also includes an operation for transmitting the measured electrical voltage present on the RF power input line as a first input signal to an analog multiplier module. The method also includes an operation for transmitting the measured electrical current present on the RF power input line as a second input signal to the analog multiplier module. The method also includes an operation for operating the analog multiplier module to generate an output signal that is a product of the first and second input signals, where the output signal indicates an instantaneous RF power present on the RF power input line of the plasma processing chamber.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
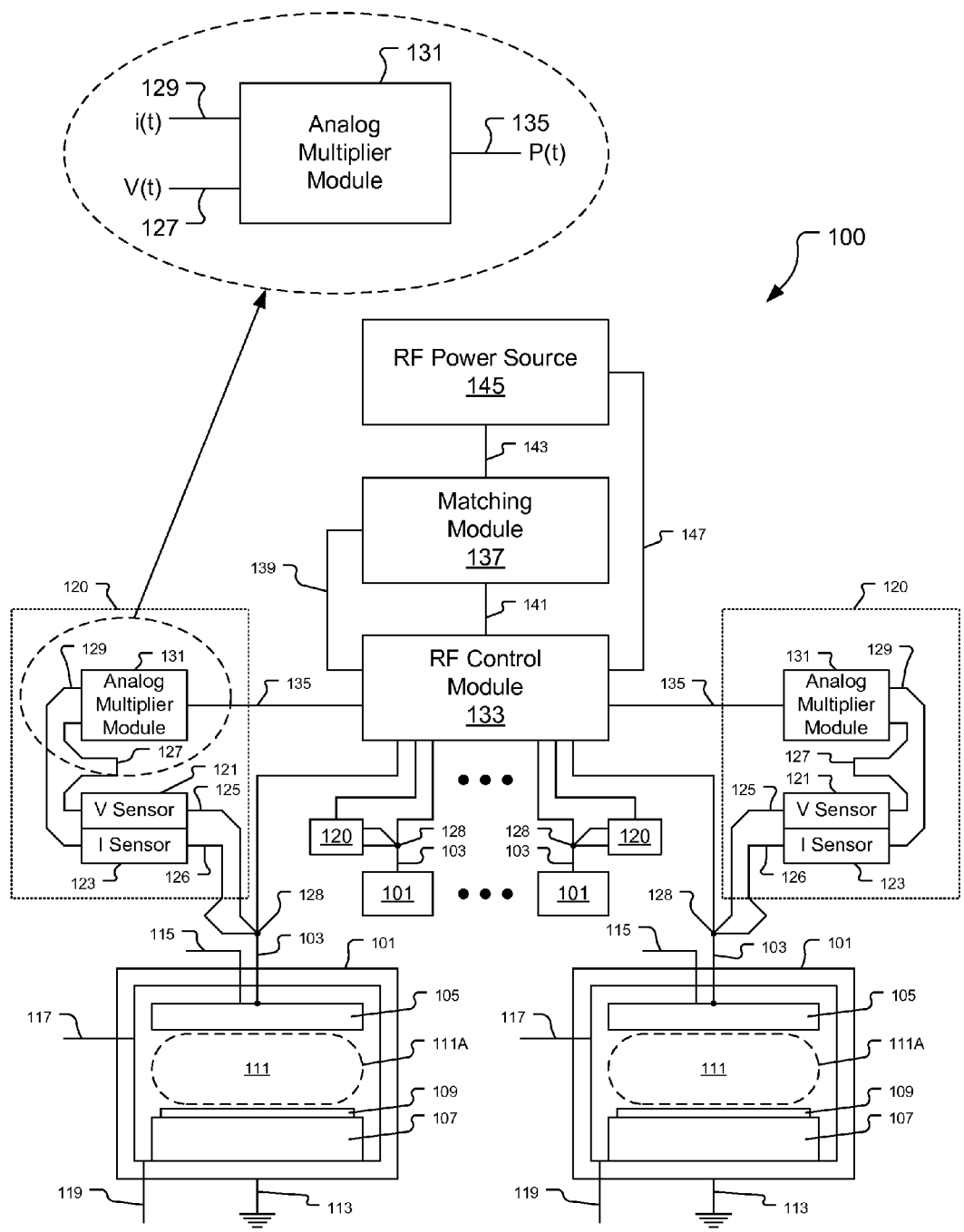
FIG. 1 shows a system for plasma processing of one or more semiconductor substrates, in accordance with some example embodiments of the present invention.

FIG. 1 shows a system 100 for plasma processing of one or more semiconductor substrates, in accordance with some example embodiments of the present invention. The system 100 includes a plurality of plasma processing chambers 101 connected to receive RF power from an RF power source 145 by way of a matching module 137 and an RF control module 133. Specifically, each of the plurality of plasma processing chambers 101 respectively includes an RF power input line 103 through which RF power is transmitted to generate a plasma 111 within the plasma processing chamber 101. The RF power received through the RF power input line 103 is directed to one or more electrodes 105 within the chamber 101. The one or more electrodes 105 can include one or more of a top electrode (e.g., a showerhead electrode or solid electrode, among others), a bottom electrode (e.g., an electrostatic chuck or substrate support, among others), and a side electrode (e.g., a peripheral ring-shaped electrode, among others), where the top, bottom, and side electrodes are configured around a plasma processing region 111A.

The example plasma processing chambers 101 of FIG. 1 show the RF power input line 103 connected to a top electrode 105, with the top electrode 105 positioned above the plasma processing region 111A. A substrate 109 that is to be subjected to plasma processing within the chamber 101 is disposed on a substrate support 107 below the plasma processing region 111A. In various embodiments, the substrate support 107 can be an electrostatic chuck or other type of substrate support member. Also, in various embodiments, the substrate support 107 can be configured to include various cooling mechanisms, heating mechanisms, clamping mechanisms, bias electrodes, and/or sensors, where the sensors can provide for measurement of temperature, pressure, electrical voltage, and/or electrical current, among other parameters. The chamber 101 includes an exterior structure formed around the plasma processing region 111A to enclose the top electrode 105 and the substrate support 107. The exterior structure of the chamber 101 can be formed of an electrically conductive material and have an electrical connection to reference ground potential 113.

In an example embodiment, the term substrate 109 as used herein refers to a semiconductor wafer. However, it should be understood that in other embodiments, the term substrate 109 as used herein can refer to substrates formed of sapphire, GaN, GaAs or SiC, or other substrate materials, and can include glass panels/substrates, metal foils, metal sheets, polymer materials, or the like. Also, in various embodiments, the substrate 109 as referred to herein may vary in form, shape, and/or size. For example, in some embodiments, the substrate 109 as referred to herein may correspond to a 200 mm (millimeters) semiconductor wafer, a 300 mm semiconductor wafer, or a 450 mm semiconductor wafer. Also, in some embodiments, the substrate 109 as referred to herein may correspond to a non-circular substrate, such as a rectangular substrate for a flat panel display, or the like, among other shapes.

The chamber 101 includes one or more process gas input lines 115, 117 configured to directed a controlled flow of one or more process gases into the plasma processing region 111A. In an example embodiment where the top electrode 105 is formed as a showerhead electrode, the process gas input line 115 can be connected to flow process gases to the showerhead electrode, with the showerhead electrode in turn directing the flow of the process gases into the plasma processing region 111A. And, in an example embodiment, the process gas input line 117 can be configured to direct a flow of process gases into the plasma processing region 111A from a side location. The chamber 101 also includes an exhaust line 119 connected to provide for removal of fluids (gases and/or liquids) from the interior volume of the chamber 101.

It should be understood that the chambers 101 depicted in FIG. 1 and described above are simplified for ease of description. In reality, each of the plurality of plasma processing chambers 101 is a complex system that includes many components not described herein. However, what should be appreciated for the present discussion is that each of the plurality of plasma processing chambers 101 is connected to receive RF power through one or more RF power input lines 103, and is configured to apply the received RF power to generate the plasma 111 under carefully controlled conditions to produce desired effects on the substrate 109 upon exposure of the substrate 109 to the plasma 111 or to reactive constituents (e.g., ions, radicals, etc.) generated within the plasma 111. Examples of plasma processing operations that may performed by the various plasma processing chambers 101 include etching operations, deposition operations, and ashing operations, among others.

The RF power source 145 is configured to generate RF power, in the form of RF signals, for transmission to the plurality of plasma processing chambers 101. RF signals generated by the RF power source 145 are transmitted through a connection 143 to the matching module 137. The matching module 137 is configured to match impedances within the system 100 so that the RF signals generated by the RF power source 145 can be transmitted effectively to the plasma 111 loads within the various plasma processing chambers 101. Generally speaking, the matching module 137 is a network of capacitors and inductors that can be adjusted to tune impedance encountered by the RF signals in their transmission through the system 100 to the plasma 111 loads within the various plasma processing chambers 101. From the matching module 137, the RF signals are transmitted through a connection 141 to the RF control module 133.

In various embodiments, the RF power source 145 can include one or more RF power sources operating at one or more frequencies. Multiple RF frequencies can be supplied to the same plasma processing chamber 101 at the same time. In some embodiments, frequencies of the RF power source 145 are set within a range extending from 1 kHz (kiloHertz) to 100 MHz (megaHertz). In some embodiments, frequencies of the RF power source 145 are set within a range extending from 400 kHz to 60 MHz. In some embodiments, the RF power source 145 is set to generate RF signals at frequencies of 2 MHz, 27 MHz, and 60 MHz. In some embodiments, the RF power source 145 is set to generate one or more high frequency RF signals within a frequency range extending from about 1 MHz to about 60 MHz, and generate one or more low frequency RF signals within a frequency range extending from about 100 kHz to about 1 MHz. It should be understood that the above-mentioned frequency ranges are provided by way of example. In practice, the RF power source 145 can be configured to generate essentially any RF signal having essentially any frequency as needed to generate the plasma 111 within a given plasma processing chamber 101. Additionally, the system 100 can include frequency-based filtering, i.e., high-pass filtering and/or low-pass filtering, to ensure that specified RF signal frequencies are transmitted to the RF control module 133.

The RF control module 133 is connected to receive the RF power generated by the RF power source 145 and distribute a respective portion of the RF power to each RF power input line 103 of the plurality of plasma processing chambers 101. In various embodiments, the RF control module 133 can include one or more of variable capacitors, variable coil inductors, and other types of electronic devices to adjust and control the amount of RF power delivered to each chamber 101. In some embodiments, variable capacitors and/or variable coil inductors within the RF control module 133 can be controlled by motors and/or switches. The RF control module 133 is configured to independently control the amount of RF power delivered to each of the plurality of plasma processing chambers 101. Also, any number of plasma processing chambers 101 can be connected to receive RF power from the RF power source 145 by way of the RF control module 133. In some scenarios, the RF control module 133 can be operated to deliver substantially equal amounts of RF power to each of the multiple chambers 101, while in other scenarios, the RF control module 133 can be operated to deliver distinctly different amounts of RF power to different ones of the multiple chambers 101. In various embodiments, the RF power used to generate the plasma 111 from the process gases can range from about 50 Watts to about 500 Watts per chamber 101.

Also, in some embodiments, the RF control module 133 is configured to transmit control signals through a connection 147 to the RF power source 145, so as to direct adjustments in the operation of the RF power source 145 in order to achieve a prescribed RF power delivery to one or more of the chambers 101. Similarly, in some embodiments, the RF control module 133 is configured to transmit control signals through a connection 139 to the matching module 137, so as to direct adjustments in the operation of the matching module 137 in order to achieve a prescribed RF power delivery to one or more of the chambers 101. Additionally, signals conveying the operational status/condition of the RF power source 145 can be transmitted from the RF power source 145 through the connection 147 to the RF control module 133. And, similarly, signals conveying the operational status/condition of the matching module 137 can be transmitted from the matching module 137 through the connection 139 to the RF control module 133. In this manner, a closed-loop feedback and monitoring network can be established between the RF control module 133 and each of the RF power source 145 and matching module 137.

Referring back to FIG. 1, the system 100 further includes a plurality of instantaneous RF power measurement systems 120 respectively connected to each of the plurality of plasma processing chambers 101. Each of the plurality of instantaneous RF power measurement systems 120 is connected to measure the instantaneous RF power delivered through the RF power input line 103 of a given one of the plurality of plasma processing chambers 101. Each of the instantaneous RF power measurement systems 120 includes a voltage sensor 121, a current sensor 123, and an analog multiplier module 131. In this manner, the system 100 includes a plurality of voltage sensors 121 respectively connected to the RF power input lines 103 of the plurality of plasma processing chambers 101, such that each of the plurality of plasma processing chambers 101 has a separate one of the plurality of voltage sensors 121 connected to its RF power input line 103. And, in this manner, the system 100 includes a plurality of current sensors 123 respectively connected to the RF power input lines 103 of the plurality of plasma processing chambers 101, such that each of the plurality of plasma processing chambers 101 has a separate one of the plurality of current sensors 123 connected to its RF power input line 103. And, in this manner, the system 100 includes a plurality of analog multiplier modules 131 respectively corresponding to the plurality of plasma processing chambers 101.

Each of the plurality of voltage sensors 121 has an input 125 connected to the RF power input line 103 of its corresponding plasma processing chamber 101 at a connection location 128 just outside its corresponding plasma processing chamber 101. In one embodiment, the voltage sensors and current sensors are located about 10 inches or less from the RF input to the tool, and generally within 20 inches. In some embodiments, the distance may be within about 130 feet for remote applications, wherein such a sensor is located inside a proprietary RF generator. Similarly, each of the plurality of current sensors 123 has an input 126 connected to the RF power input line 103 of its corresponding plasma processing chamber 101 at the connection location 128 just outside its corresponding plasma processing chamber 101. Therefore, both the voltage sensor 121 and the current sensor 123 corresponding to a given one of the plurality of plasma processing chambers 101 are connected to the RF power input line 103 of the given one of the plurality of plasma processing chambers 101 at a substantially same connection location 128. In some embodiments, an electrical transmission line length from the connection location 128 on the RF power input line 103 of a given one of the plurality of plasma processing chambers 101 to the corresponding voltage sensor 121 is substantially equal to an electrical transmission line length from the connection location 128 on the RF power input line 103 of the given one of the plurality of plasma processing chambers 101 to the corresponding current sensor 123.

Each of the plurality of voltage sensors 121 has an output 127 connected to a first input of the corresponding analog multiplier module 131. Each of the plurality of voltage sensors 121 is configured to output a signal indicating an instantaneous electrical voltage (V(t)) present on the RF power input line 103 to which it is connected. Each of the plurality of current sensors 123 has an output 129 connected to a second input of the corresponding analog multiplier module 131. Each of the plurality of current sensors 123 is configured to output a signal indicating an instantaneous electrical current (i(t)) present on the RF power input line 103 to which it is connected. In some embodiments, an electrical transmission line length from the voltage sensor 121 corresponding to the given one of the plurality of plasma processing chambers 101 to the analog multiplier module 131 corresponding to the given one of the plurality of plasma processing chambers 101 is substantially equal to an electrical transmission line length from the current sensor 123 corresponding to the given one of the plurality of plasma processing chambers 101 to the analog multiplier module 131 corresponding to the given one of the plurality of plasma processing chambers 101.

Each of the plurality of analog multiplier modules 131 is connected to receive as a first input signal, the signal indicating the instantaneous electrical voltage (V(t)) present on the RF power input line of its corresponding plasma processing chamber 101 as output by the corresponding one of the plurality of voltage sensors 121. Also, each of the plurality of analog multiplier modules 131 is connected to receive as a second input signal, the signal indicating the instantaneous electrical current (i(t)) present on the RF power input line 103 of its corresponding plasma processing chamber 101 as output by the corresponding one of the plurality of current sensors 123. And, each of the plurality of analog multiplier modules 131 is configured to generate an output signal representing a mathematical product of its first and second input signals, and transmit the output signal through a connection 135 to the RF control module 133. The output signal of a given one of the plurality of analog multiplier modules 131 indicates an instantaneous RF power (P(t)) present on the RF power input line 103 of the plasma processing chamber 101 corresponding to the given one of the plurality of analog multiplier modules 131.

Each of the plurality of analog multiplier modules 131 includes high-bandwidth analog multiplier circuitry configured to operate at a frequency greater than a highest RF signal frequency transmitted through the RF power input line 103 of its corresponding plasma processing chamber 101. In some embodiments, each of the plurality of analog multiplier modules 131 is configured to operate at a frequency at least five times greater than a highest frequency of the RF power generated by the RF power source 145. In some embodiments, each of the plurality of analog multiplier modules 131 is configured to operate at a frequency of about 300 MHz. Also, in some embodiments, each of the plurality of analog multiplier modules 131 is configurable with regard to its operating frequency. It should be understood that use of an analog multiplier module 131 that operates at too low of a frequency, i.e., too low of a bandwidth, can cause harmonic distortion, which may result in an error in the instantaneous RF power measurement.

It should be appreciated that the high-bandwidth analog multiplier integrated circuits within each of the plurality of analog multiplier modules 131 provides comfortable margin over the MHz level of RF excitation frequencies of many RF plasma processing applications. Therefore, with the high-bandwidth analog multiplier integrated circuits within each of the plurality of analog multiplier modules 131, it is possible to sample both the instantaneous electrical voltage (V(t)) and the instantaneous electrical current (i(t)) present on the RF power input line with high-frequency and small delay relative to each other in order to get a meaningful measurement of the instantaneous RF power (P(t)) present on the RF power input line, while avoiding a need for phase measurement and processing.

In some embodiments, the RF control module 133 is configured to process the instantaneous RF power (P(t)) as indicated by the output signal of a given one of the plurality of analog multiplier modules 131 to determine a value of a corresponding RF power parameter. In various embodiments, the RF power parameter can be a peak amplitude, a peak-to-peak amplitude (double the peak amplitude), a root-mean-square (RMS) amplitude, a power factor (which would take into account the phase), delivered power (the resistive component of the power), reactance of the power, among others, or any combination thereof. Also, in some embodiments, the RF control module 133 is configured to compare the determined value of the RF power parameter to a prescribed value for the RF power parameter for the plasma processing chamber 101 corresponding to the given one of the plurality of analog multiplier modules 131, and based on the comparison adjust an amount of RF power delivered to the plasma processing chamber 101 corresponding to the given one of the plurality of analog multiplier modules 131, so as to substantially equal the prescribed value for the RF power parameter. In some embodiments, the RF control module 133 is configured to adjust the amount of RF power delivered to the plasma processing chamber 101 by adjusting one or more settings of a variable capacitor, a variable coil inductor, or both a variable capacitor and a variable coil inductor, where the variable capacitor and/or variable coil inductor can reside in one or more of the RF control module 133, the matching module 137, and the RF power source 145.

The system 100 provides for accurate measurement of the instantaneous RF power (P(t)) delivered to a given plasma processing chamber 101 by multiplying the instantaneous RF voltage (V(t)) and the instantaneous RF current (i(t)) present on the RF power input line 103 of the given chamber 101, as shown by $P(t)=V(t)i(t)$. This approach for measuring the instantaneous RF power present on the RF power input line 103 of a given chamber 101 has been shown to be accurate to within two percent of true delivered RF power, even with calibration, for both resistive loads as well as more sophisticated reactive loads commonly found in real semiconductor fabrication processes.

It should be appreciated that the system 100, and each of the instantaneous RF power measurement systems 120 therein, operates based on the actual, instantaneously measured RF voltage and RF current present on the RF power input line 103, as opposed to using a representation of the actual RF voltage and RF current present on the RF power input line 103, such as either a half-amplitude representation, or a full-amplitude representation, or a root-mean-square (RMS) representation. Also, it should be understood that the approach of multiplying the instantaneous voltage (V(t)) and the instantaneous current (i(t)) present on the RF power input line 103 to obtain the instantaneous power (P(t)) present on the RF power input line 103, as disclosed herein, does not require measurement of a phase difference between the RF voltage and the RF current present on the RF power input line 103. For example, conventional RF power is measured with directional couplers or voltage/current/phase probes. In those arrangements, a scalar RF power is calculated by equation 1 below.

$$P = \tfrac{1}{2} V_p i_p \cos \phi = V_{rms} i_{rms} \cos \phi \quad \text{(equation 1):}$$

Calculations, such as the above example that measures phase can be complex and correspondingly expensive. Another limitation with such calculations is associated with limitations related to range and power sensitivity.

Another common method of measuring the phase is via a vector impedance method, as shown in equations 2 and 3 below.

$$\text{Magnitude} = \text{Abs}(V) = \sqrt{[\Re e\{V\}]^2 + [\Im m\{V\}]^2} \quad \text{equation 2—Magnitude,}$$

$$\text{Phase} = \arg(V) = \arctan(\Im m\{V\}/\Re e\{V\}) \quad \text{and equation 3—Phase:}$$

According to Equations 2 and 3, because of ARCTAN, which goes to infinity at 90 degree, the accuracy is bad near 90 degrees and typically it is a desire to avoid using them above 82 degrees of phase. However, real systems, especially capacitive coupled plasma (CCP) systems, may very often have phase offsets closer to 90 degrees. Further, unlike capacitors, inductors, and resistors, plasma chambers impose a highly non-linear load, which causes the sinusoidal waveform of the input power to become distorted. This distortion causes the resulting waveform to be a sum of sinusoids, with the frequency of each additional sinusoid being some integer multiple of the input sinusoidal frequency (i.e., harmonics). As noted, conventional probes can provide voltage, current and coarse phase information, at best, for the fundamental voltage and current waveforms. Consequently, this also severely limits the accuracy of the system that operates based on Equations 2 and 3, and makes accurate and repeatable control impossible when there is a significant amount of voltage or current appearing in the harmonics.

It should be appreciated that phase information for the RF voltage and RF current present on the RF power input line 103 is implicitly captured by way of measuring the instantaneous RF voltage and instantaneous RF current, whereas such phase information is not present within a determination of scalar peak-to-peak RF voltage or scalar peak-to-peak RF current. Therefore, by measuring instantaneous RF voltage and instantaneous RF current in real-time, it is not necessary to determine phase information for either the RF voltage of the RF current present on the RF power input line 103. Furthermore, it should be understood that the measurement of instantaneous RF voltage and instantaneous RF current in real-time does not suffer from the above-noted drawbacks of conventional calculations as discussed with regard to Equations 1, 2, and 3.

Figure 2:
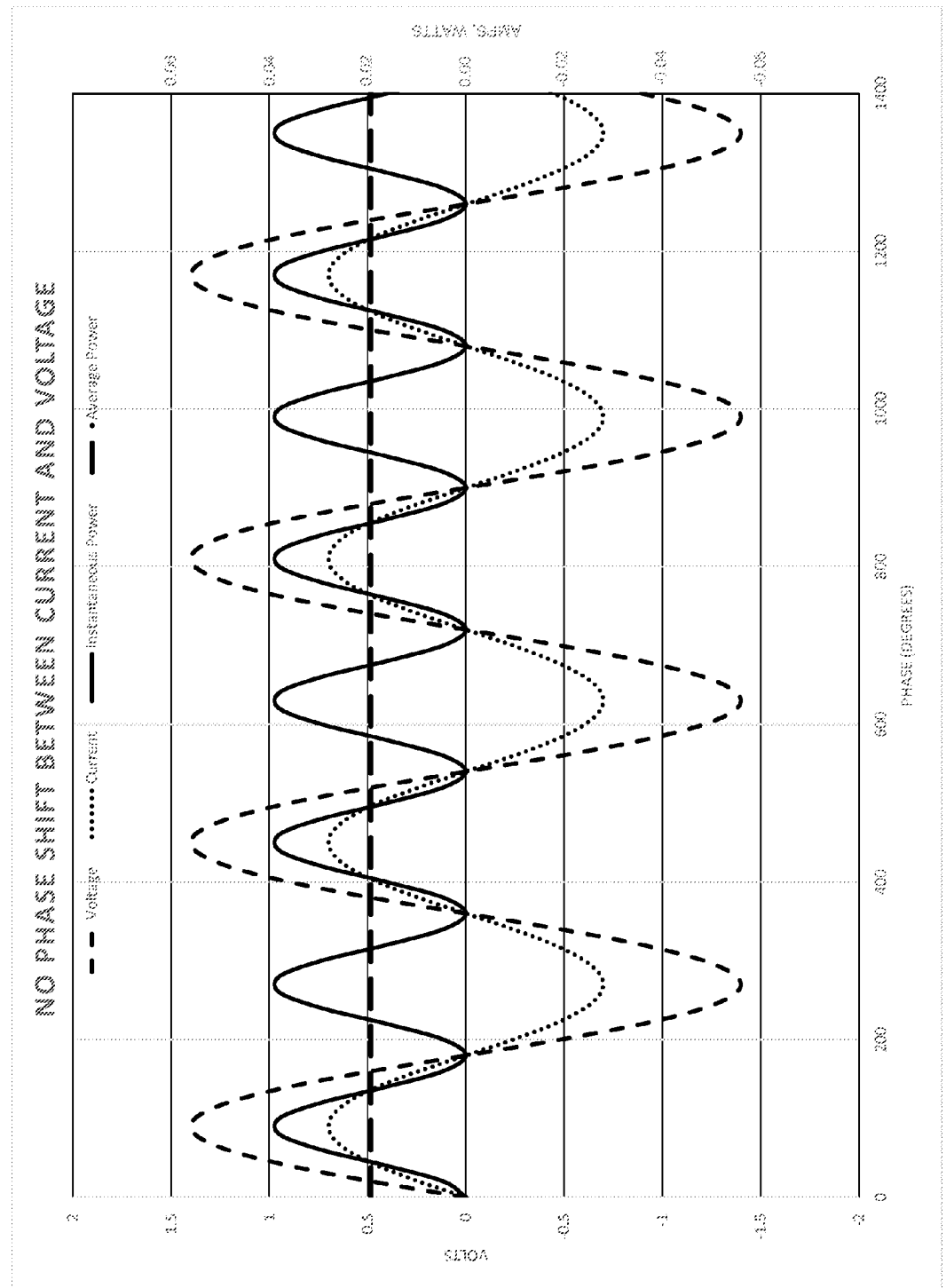
FIG. 2 shows waveforms of RF voltage, RF current, and corresponding instantaneous RF power as generated by the analog multiplier module in the system of FIG. 1, with no phase shift between the RF current and the RF voltage, in accordance with an example embodiment of the present invention.
Figure 3:
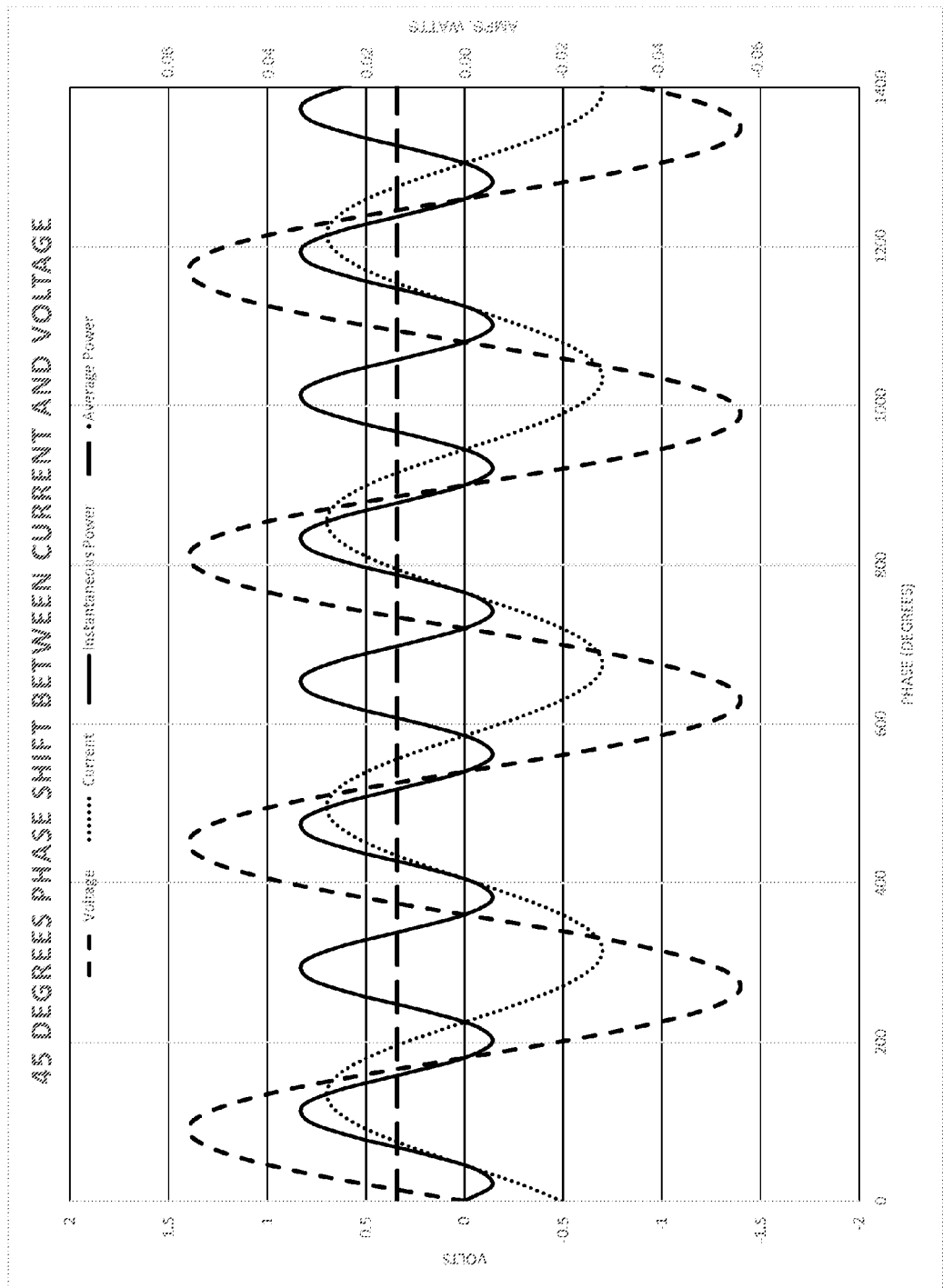
FIG. 3 shows waveforms of RF voltage, RF current, and corresponding instantaneous RF power as generated by the analog multiplier module in the system of FIG. 1, with a phase shift of 45 degrees between the RF current and the RF voltage, in accordance with an example embodiment of the present invention.
Figure 4:
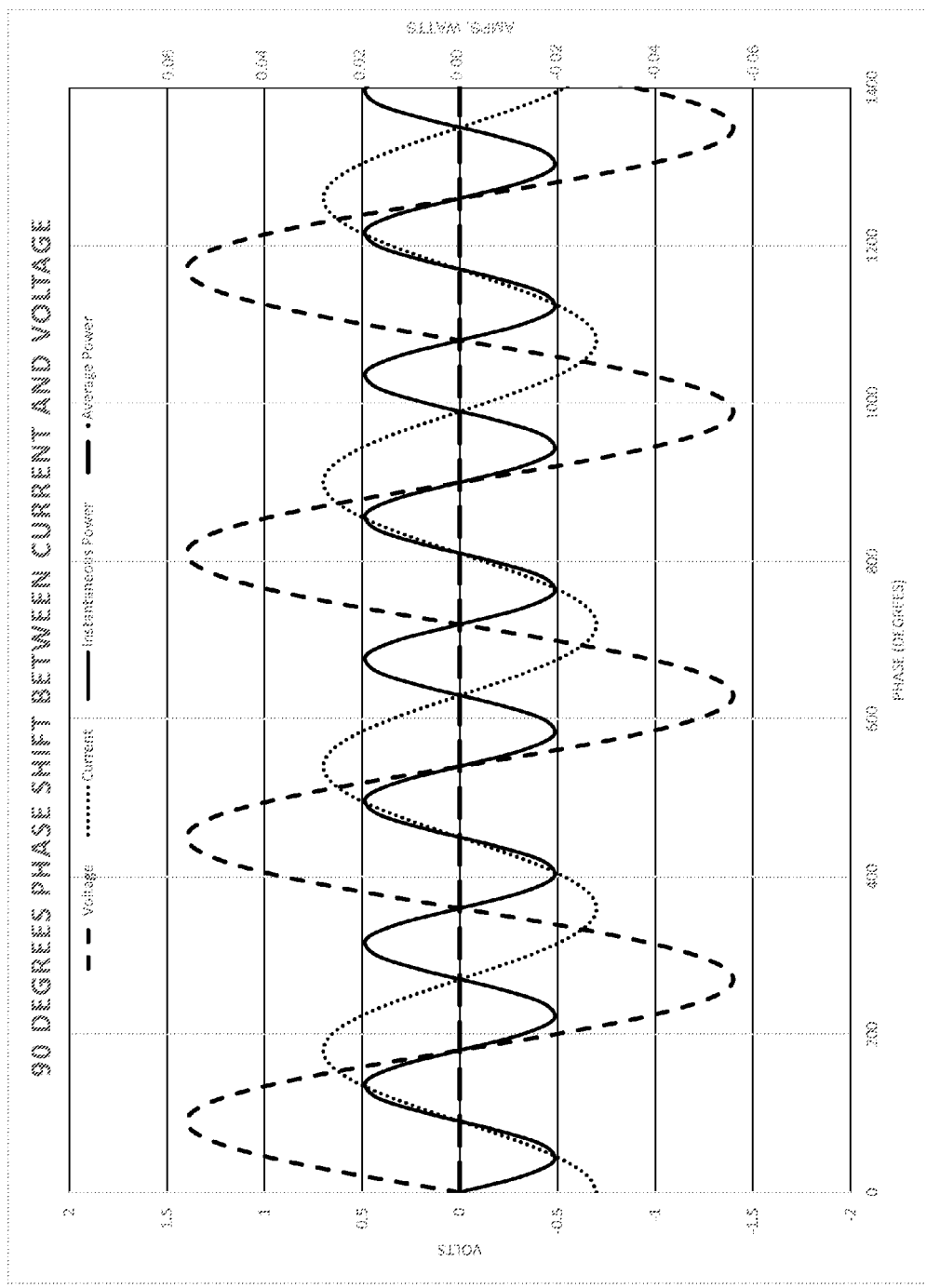
FIG. 4 shows waveforms of RF voltage, RF current, and corresponding instantaneous RF power as generated by the analog multiplier module in the system of FIG. 1, with a phase shift of 90 degrees between the RF current and the RF voltage, in accordance with an example embodiment of the present invention.

For example, FIG. 2 shows waveforms of RF voltage, RF current, and corresponding instantaneous RF power as generated by the analog multiplier module 131 in the system 100, with no phase shift between the RF current and the RF voltage, in accordance with an example embodiment of the present invention. As shown in FIG. 2, the instantaneous RF power is the product of the instantaneous RF voltage and the instantaneous RF current, with no phase shift between the RF current and the RF voltage. Similarly, FIG. 3 shows waveforms of RF voltage, RF current, and corresponding instantaneous RF power as generated by the analog multiplier module 131 in the system 100, with a phase shift of 45 degrees between the RF current and the RF voltage, in accordance with an example embodiment of the present invention. As shown in FIG. 3, the instantaneous RF power continues to represent the product of the instantaneous RF voltage and the instantaneous RF current, despite the phase shift of 45 degrees between the RF current and the RF voltage. And, FIG. 4 shows waveforms of RF voltage, RF current, and corresponding instantaneous RF power as generated by the analog multiplier module 131 in the system 100, with a phase shift of 90 degrees between the RF current and the RF voltage, in accordance with an example embodiment of the present invention. As shown in FIG. 4, the instantaneous RF power continues to represent the product of the instantaneous RF voltage and the instantaneous RF current, even despite the phase shift of 90 degrees between the RF current and the RF voltage.

Also, it should be understood that the approach of multiplying the instantaneous voltage (V(t)) and the instantaneous current (i(t)) present on the RF power input line 103 to obtain the instantaneous RF power (P(t)) present on the RF power input line 103, as disclosed herein, does not rely upon determination of a peak-to-peak RF voltage and/or determination of a peak-to-peak RF current. The peak-to-peak RF voltage has an indirect relationship to RF power. The relationship between peak-to-peak RF voltage and RF power can be calibrated for a particular plasma process, but such a calibration is not linear. Moreover, the relationship between peak-to-peak RF voltage and RF power varies significantly from plasma process-to-plasma process. Therefore, calibration of the relationship between peak-to-peak RF voltage and RF power for all possible plasma processing conditions of interest is awkward, time consuming, and fundamentally an indirect measurement of RF power. In contrast to using peak-to-peak RF voltage to determine RF power, the instantaneous RF power measurement provided by the analog multiplier modules 131 in the system 100 as disclosed herein is does not require process dependent calibration, but rather is a direct measurement of RF power actually delivered to a given plasma processing chamber 101 without concern for phase shifting or calibration.

Figure 5A:
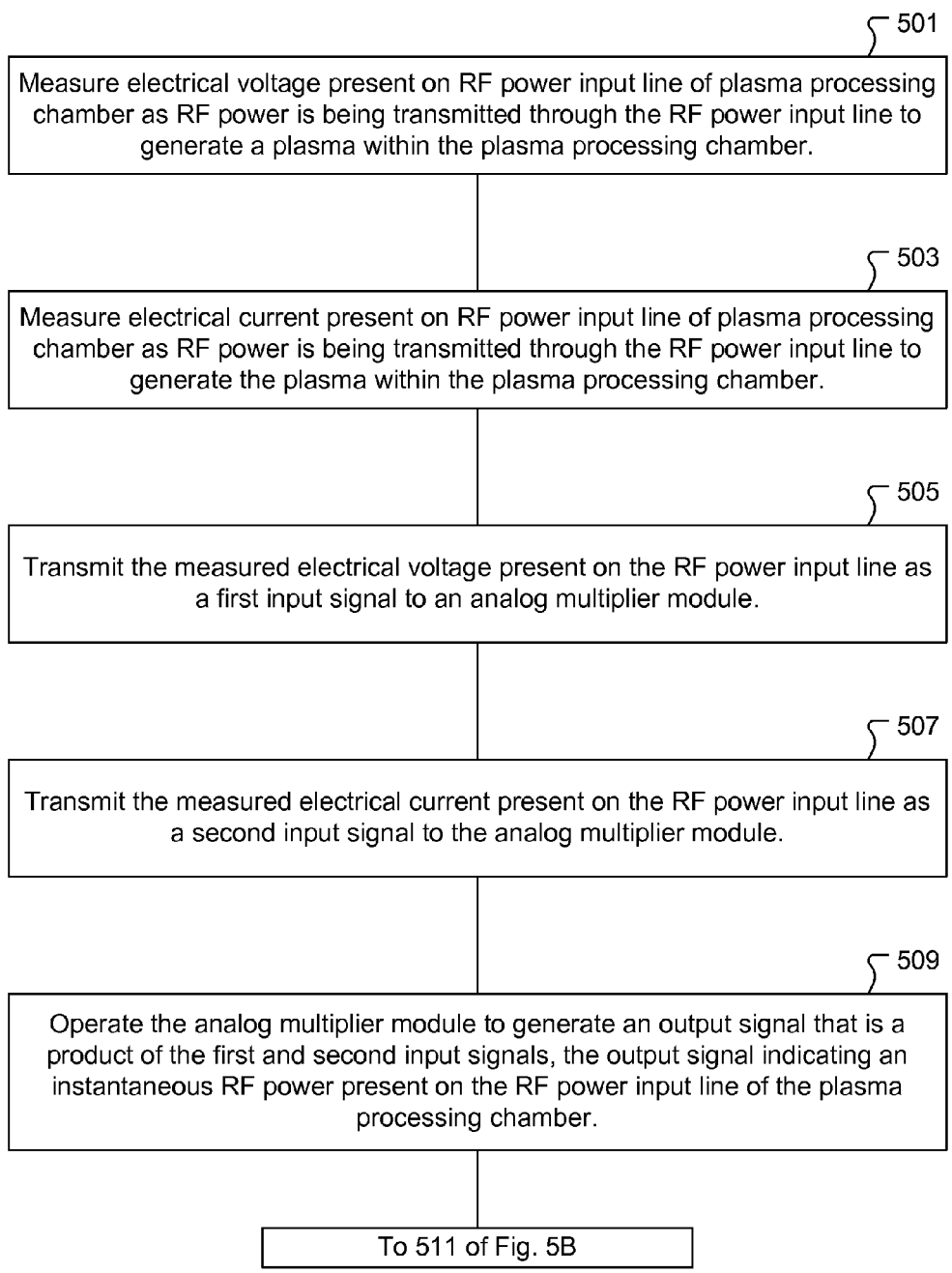
FIG. 5A shows a flowchart of a method for measuring instantaneous RF power supplied to a plasma processing chamber, in accordance with some example embodiments of the present invention.

FIG. 5A shows a flowchart of a method for measuring instantaneous RF power supplied to a plasma processing chamber, in accordance with some example embodiments of the present invention. The method includes an operation 501 for measuring an electrical voltage present on an RF power input line of the plasma processing chamber as RF power is being transmitted through the RF power input line to generate a plasma within the plasma processing chamber. Within the context of the system 100 of FIG. 1, the operation 501 corresponds to operation of the voltage sensor 121 to measure the instantaneous RF voltage present on the RF power input line 103 at the connection location 128. The operation 501 can be preceded by an operation for connecting a voltage sensor to the RF power input line 103 at a connection location just outside the plasma processing chamber 101, where measuring the electrical voltage present on the RF power input line in the operation 501 is done by the voltage sensor.

The method also includes an operation 503 for measuring an electrical current present on the RF power input line of the plasma processing chamber as RF power is being transmitted through the RF power input line to generate the plasma within the plasma processing chamber. Within the context of the system 100 of FIG. 1, the operation 503 corresponds to operation of the current sensor 123 to measure the instantaneous RF current present on the RF power input line 103 at the connection location 128. The operation 503 can be preceded by an operation for connecting a current sensor to the RF power input line 103 at the connection location just outside the plasma processing chamber 101, where measuring the electrical current present on the RF power input line in the operation 503 is done by the current sensor.

The method also includes an operation 505 for transmitting the measured electrical voltage present on the RF power input line as a first input signal to an analog multiplier module. Within the context of the system 100 of FIG. 1, the operation 505 corresponds to transmission of a signal representing the instantaneous RF voltage (V(t)) as measured by the voltage sensor 121 to the first input 127 of the analog multiplier module 131.

The method also includes an operation 507 for transmitting the measured electrical current present on the RF power input line as a second input signal to the analog multiplier module. Within the context of the system 100 of FIG. 1, the operation 507 corresponds to transmission of a signal representing the instantaneous RF current (i(t)) as measured by the current sensor 123 to the second input 129 of the analog multiplier module 131.

The method also includes an operation 509 in which the analog multiplier module is operated to generate an output signal that is a product of the first and second input signals, where the output signal indicates an instantaneous RF power present on the RF power input line of the plasma processing chamber. Within the context of the system 100 of FIG. 1, the operation 509 corresponds to operation of the analog multiplier module 131 to multiply the instantaneous RF voltage signal (V(t)) received at the first input 127 by the instantaneous RF current signal (i(t)) received a the second input 129 to generate a signal representing the instantaneous RF power (P(t)) present on the RF power input line 103 of the plasma processing chamber 101. In some embodiments, the analog multiplier module operates at a frequency at least five times greater than a highest frequency of any RF signal present on the RF power input line. However, it should be understood that the analog multiplier module 131 can be operated at other frequencies, so long as the operational frequency of the analog multiplier module 131 is larger than the highest frequency of the RF signals for which instantaneous RF power is measured.

Figure 5B:
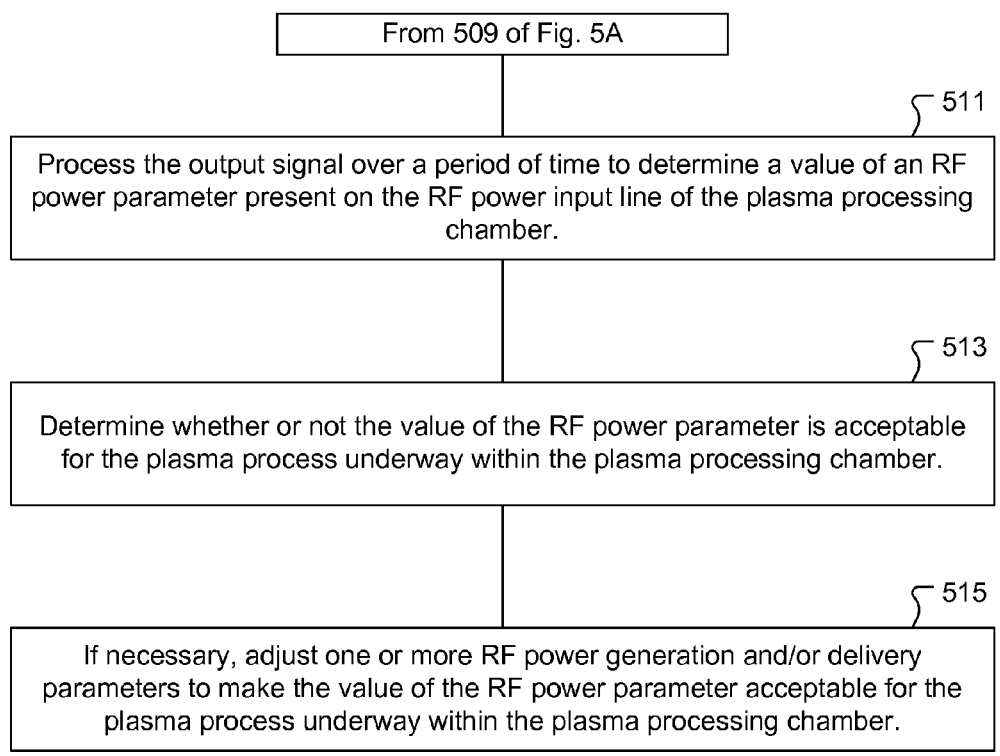
FIG. 5B shows a flowchart of an extension of the method for measuring instantaneous RF power supplied to the plasma processing chamber as depicted in FIG. 5A, in accordance with some example embodiments of the present invention.

FIG. 5B shows a flowchart of an extension of the method for measuring instantaneous RF power supplied to the plasma processing chamber as depicted in FIG. 5A, in accordance with some example embodiments of the present invention. The method includes an operation 511 for processing the output signal generated by the analog multiplier module over a period of time to determine values of one or more RF power parameters present on the RF power input line. In various embodiments, the one or more RF power parameters can include one or more of a peak amplitude, a peak-to-peak amplitude (double the peak amplitude), a root-mean-square (RMS) amplitude, a power factor (which would take into account the phase), delivered power (the resistive component of the power), reactance of the power, among others, and any combination thereof. Within the context of the system 100 of FIG. 1, the operation 511 can be performed by circuitry within the RF control module 133 to determine the values of the one or more RF power parameters present on the RF power input line 103 of each chamber 101.

The method continues with an operation 513 for determining that the value of at least one RF power parameter present on the RF power input line is not equal to a prescribed value for the RF power parameter for a plasma process underway within the plasma processing chamber. Within the context of the system 100 of FIG. 1, the operation 513 can be performed by comparing the determined value of the RF power parameter to a prescribed value for the RF power parameter for a particular chamber 101 as stored in a computer memory of the RF control module 133 or as stored in a computer memory accessible by the RF control module 133.

The method also includes an operation 515 for adjusting, if necessary, one or more RF generation parameters and/or one or more RF delivery parameters to make the value of the RF power parameter present on the RF power input line substantially equal to the prescribed value for the RF power parameter for the plasma process underway within the plasma processing chamber. Within the context of the system 100 of FIG. 1, the operation 513 can be performed by the RF control module operating to adjust one or more settings either within the RF control module 133, the RF power source 145, the matching module 137, or combination thereof, to cause a change in the RF power delivered to a particular chamber 101 such that the value of the RF power parameter present on the RF power input line 103 of the particular chamber 101 is substantially equal to the prescribed value for the RF power parameter for the plasma process underway within the particular chamber 101. In some embodiments, the operation 515 can include the RF control module 133 operating to direct a change in one or more settings of a variable capacitor, a variable coil inductor, or both a variable capacitor and a variable coil inductor.

Additionally, in some embodiments, the method can include performing operations 501, 503, 505, 507, and 509 in a simultaneous manner for each of the plurality of plasma processing chambers 101 using the plurality of voltage sensors 121, the plurality of current sensors 123, and the plurality of analog multiplier modules 131, such that each of the plurality of plasma processing chambers 101 has a unique correspondence to a different one of the plurality of voltage sensors 121, and to a different one of the plurality of current sensors 123, and to a different one of the plurality of analog multiplier modules 131. The output signals generated by the plurality of analog multiplier modules 131 are transmitted as respective instantaneous RF power signals (P(t)) to circuitry within the RF control module 133.

The RF control module 133 can then be operated to process each of the instantaneous RF power signals (P(t)) over a period of time to determine a value of at least one corresponding RF power parameter present on each RF power input line 103 of the plurality of plasma processing chambers 101. In various embodiments, the RF power parameter can be a peak amplitude, a peak-to-peak amplitude (double the peak amplitude), a root-mean-square (RMS) amplitude, a power factor (which would take into account the phase), delivered power (the resistive component of the power), reactance of the power, among others, or any combination thereof. And, based on the determined values of the RF power parameters, the RF control module 133 can be operated to determine that a distribution of a total RF power to the plurality of plasma processing chambers 101 is not equal to a prescribed RF power distribution to the plurality of plasma processing chambers 101. And, upon making this determination, the RF control module 133 can be operated to adjust one or more RF generation parameters and/or one or more RF delivery parameters to make the corresponding RF power present on each RF power input line 103 of the plurality of plasma processing chambers 101 equal to the prescribed RF power distribution to the plurality of plasma processing chambers 101.

As discussed herein, some multiple chamber plasma processing systems, such as the system 100 shown in FIG. 1, include multiple plasma processing chambers connected to receive their RF power from a common RF power source, where the RF power output by the common RF power source is distributed in a divided manner among the multiple chambers of the multiple chamber plasma processing system. In some embodiments of the multiple chamber plasma processing systems, it may be intended that the total RF power generated by the common RF power source be distributed to the multiple chambers in an even manner. However, due to complexities in RF power transmission networks to the various chambers and due to variations in plasma load conditions among the various chambers, it is often not possible to passively obtain a even distribution of the total RF power among the multiple chambers. Also, in some embodiments of the multiple chamber plasma processing systems, it may be desired to distribute the total RF power in an intentionally uneven manner among the multiple chambers. Therefore, just knowing the total RF power generated by the common RF power source is not sufficient to understand how the total RF power is actually distributed to the multiple chambers. In following, it is of interest to be able to measure actual RF power delivered to each particular one of the multiple chambers in a cost effective manner.

The system 100 and associated methods disclosed herein provide a direct way to separately and independently measure instantaneous RF power delivered to each chamber 101 in the multiple chamber processing system 100. Use of the high-frequency/high-bandwidth analog multiplier modules 131 as disclosed herein avoids the use of more complex and expensive RF power measurement devices such as directional couplers and/or voltage/current/phase probes. For example, the directional couplers require perfect matching of sophisticated transmission line segments which leads to complexity and increased cost. Similarly, the voltage/current/phase probes require sophisticated phase measurements, which lead to complexity and increased cost. And, implementation of these more complex and expensive RF power measurement devices across the multiple chambers of the multiple chamber plasma processing system can be prohibitive. Therefore, it should be appreciated that use of the instantaneous RF power measurement systems 120 equipped with high-frequency/high-bandwidth analog multiplier modules 131, as disclosed herein, provides a more cost effective solution for enabling direct, accurate, and instantaneous measurement of RF power delivered to each of multiple chambers that are connected to receive RF power in a distributed manner from a common RF power source.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A system for semiconductor substrate processing, comprising:
a plurality of plasma processing chambers, each of the plurality of plasma processing chambers respectively including a radiofrequency (RF) power input line through which RF power is transmitted to generate a plasma within the plasma processing chamber;
a radiofrequency (RF) power source configured to generate RF power for transmission to the plurality of plasma processing chambers;
an RF control module connected to receive the RF power generated by the RF power source and distribute a respective portion of the RF power to each RF power input line of the plurality of plasma processing chambers;
a plurality of voltage sensors respectively connected to the RF power input lines of the plurality of plasma processing chambers, such that each of the plurality of plasma processing chambers has a separate one of the plurality of voltage sensors connected to its RF power input line, each of the plurality of voltage sensors configured to output a signal indicating an instantaneous electrical voltage present on the RF power input line to which it is connected;
a plurality of current sensors respectively connected to the RF power input lines of the plurality of plasma processing chambers, such that each of the plurality of plasma processing chambers has a separate one of the plurality of current sensors connected to its RF power input line, each of the plurality of current sensors configured to output a signal indicating an instantaneous electrical current present on the RF power input line to which it is connected; and
a plurality of analog multiplier modules respectively corresponding to the plurality of plasma processing chambers, each of the plurality of analog multiplier modules connected to receive as a first input signal the signal indicating the instantaneous electrical voltage present on the RF power input line of its corresponding plasma processing chamber as output by the corresponding one of the plurality of voltage sensors, each of the plurality of analog multiplier modules connected to receive as a second input signal the signal indicating the instantaneous electrical current present on the RF power input line of its corresponding plasma processing chamber as output by the corresponding one of the plurality of current sensors, each of the plurality of analog multiplier modules configured to generate an output signal representing a product of its first and second input signals, the output signal of a given one of the plurality of analog multiplier modules indicating an instantaneous RF power present on the RF power input line of the plasma processing chamber corresponding to the given one of the plurality of analog multiplier modules.

2. The system of claim 1, wherein the RF power source is configured to generate multiple RF signals at different frequencies.

3. The system of claim 1, wherein the RF control module is configured to process the instantaneous RF power as indicated by the output signal of a given one of the plurality of analog multiplier modules to determine a value of a corresponding RF power parameter, and wherein the RF control module is configured to compare the value of the corresponding RF power parameter to a prescribed value for the RF power parameter for the plasma processing chamber corresponding to the given one of the plurality of analog multiplier modules and based on the comparison adjust an amount of RF power delivered to the plasma processing chamber corresponding to the given one of the plurality of analog multiplier modules.

4. The system of claim 3, wherein the RF control module is configured to adjust the amount of RF power delivered to the plasma processing chamber by adjusting one or more settings of a variable capacitor, a variable coil inductor, or both a variable capacitor and a variable coil inductor.

5. The system of claim 1, wherein each of the plurality of analog multiplier modules operates at a frequency at least five times greater than a highest frequency of the RF power generated by the RF power source.

6. The system of claim 1, wherein each of the plurality of analog multiplier modules is configurable with regard to its operating frequency.

7. The system of claim 1, wherein both the voltage sensor and the current sensor corresponding to a given one of the plurality of plasma processing chambers are connected to the RF power input line of the given one of the plurality of plasma processing chambers at a substantially same location.

8. The system of claim 1, wherein an electrical transmission line length from the RF power input line of a given one of the plurality of plasma processing chambers to the corresponding voltage sensor is substantially equal to an electrical transmission line length from the RF power input line of the given one of the plurality of plasma processing chambers to the corresponding current sensor, and wherein an electrical transmission line length from the voltage sensor corresponding to the given one of the plurality of plasma processing chambers to the analog multiplier module corresponding to the given one of the plurality of plasma processing chambers is substantially equal to an electrical transmission line length from the current sensor corresponding to the given one of the plurality of plasma processing chambers to the analog multiplier module corresponding to the given one of the plurality of plasma processing chambers.

9. An apparatus for measuring radiofrequency (RF) power, comprising:
a voltage sensor connected to an RF power input line of a plasma processing chamber at a connection location just outside the plasma processing chamber, the voltage sensor configured to measure electrical voltage present on the RF power input line and output a signal indicative of the measured electrical voltage;
a current sensor connected to the RF power input line of the plasma processing chamber substantially near the connection location, the current sensor configured to measure electrical current present on the RF power input line and output a signal indicative of the measured electrical current; and
an analog multiplier module connected to receive as a first input signal the signal indicative of the measured electrical voltage as output by the voltage sensor, the analog multiplier module connected to receive as a second input signal the signal indicative of the measured electrical current as output by the current sensor, the analog multiplier module configured to generate an output signal representing a product of its first and second input signals, the output signal of the analog multiplier module indicating an instantaneous RF power present on the RF power input line of the plasma processing chamber,
wherein an electrical transmission line length from the RF power input line to the voltage sensor is substantially equal to an electrical transmission line length from the RF power input line to the current sensor, and wherein an electrical transmission line length from the voltage sensor to the analog multiplier module is substantially equal to an electrical transmission line length from the current sensor to the analog multiplier module.

10. The apparatus of claim 9, wherein the analog multiplier module operates at a frequency at least five times greater than a highest frequency of any RF signal present on the RF power input line.

11. The apparatus of claim 9, wherein the analog multiplier module is configurable with regard to its operating frequency.

12. A method for measuring instantaneous radiofrequency (RF) power, comprising:
a) measuring an electrical voltage present on an RF power input line of a plasma processing chamber as RF power is being transmitted through the RF power input line to generate a plasma within the plasma processing chamber;
b) measuring an electrical current present on the RF power input line of the plasma processing chamber as RF power is being transmitted through the RF power input line to generate the plasma within the plasma processing chamber;
c) transmitting the measured electrical voltage present on the RF power input line as a first input signal to an analog multiplier module;
d) transmitting the measured electrical current present on the RF power input line as a second input signal to the analog multiplier module; and
e) operating the analog multiplier module to generate an output signal that is a product of the first and second input signals, the output signal indicating an instantaneous RF power present on the RF power input line of the plasma processing chamber;
connecting a voltage sensor to the RF power input line at a connection location just outside the plasma processing chamber, wherein measuring the electrical voltage present on the RF power input line of the plasma processing chamber in operation a) is done by the voltage sensor;
connecting a current sensor to the RF power input line substantially near the connection location, wherein measuring the electrical current present on the RF power input line of the plasma processing chamber in operation b) is done by the current sensor; and
performing operations a) through e) in a simultaneous manner for each of a plurality of plasma processing chambers using a plurality of voltage sensors, a plurality of current sensors, and a plurality of analog multiplier modules, such that each of the plurality of plasma processing chambers has a unique correspondence to a different one of the plurality of voltage sensors, and to a different one of the plurality of current sensors, and to a different one of the plurality of analog multiplier modules, and such that the output signals generated by the plurality of analog multiplier modules are transmitted as respective instantaneous RF power signals to circuitry within an RF control module.

13. The method of claim 12, wherein the analog multiplier module operates at a frequency at least five times greater than a highest frequency of any RF signal present on the RF power input line.

14. The method of claim 12, further comprising:
processing the output signal generated by the analog multiplier module over a period of time to determine a value of an RF power parameter present on the RF power input line.

15. The method of claim 14, further comprising:
determining that the value of the RF power parameter present on the RF power input line is not equal to a prescribed value for the RF power parameter for a plasma process underway within the plasma processing chamber; and adjusting one or more RF generation parameters and/or one or more RF delivery parameters to make the value of the RF power parameter present on the RF power input line substantially equal to the prescribed value for the RF power parameter for the plasma process underway within the plasma processing chamber.

16. The method of claim 15, wherein the adjusting includes changing one or more settings of a variable capacitor, a variable coil inductor, or both a variable capacitor and a variable coil inductor.

17. The method of claim 12, further comprising:
operating the RF control module to process each of the instantaneous RF power signals over a period of time to determine a corresponding value of an RF power parameter present on each RF power input line of the plurality of plasma processing chambers;

based on the determined values of the RF power parameter, operating the RF control module to determine that a distribution of a total RF power to the plurality of plasma processing chambers is not equal to a prescribed RF power distribution to the plurality of plasma processing chambers; and adjusting one or more RF generation parameters and/or one or more RF delivery parameters to make the RF power present on each RF power input line of the plurality of plasma processing chambers equal to the prescribed RF power distribution to the plurality of plasma processing chambers.

* * * * *